United States Patent
Pan et al.

(10) Patent No.: US 6,702,007 B1
(45) Date of Patent: Mar. 9, 2004

(54) HEAT SINK STRUCTURE

(76) Inventors: Kuan-Da Pan, No. 24-8, Lane 22, Sec. 2, Minyi Rd., Wugu Shiang, Taipei (TW); Po-Chou Shih, 12F, No. 123-1, Hsing-De Rd., Sanchung, Taipei (TW); Kuei-Yin Kuo, 12F, No. 123-1, Hsing-De Rd., Sanchung, Taipei (TW); Chia-Min Chou, 12F, No. 123-1, Hsing-De Rd., Sanchung, Taipei (TW)

( * ) Notice: Subject to any disclaimer, the term of this patent is extended or adjusted under 35 U.S.C. 154(b) by 14 days.

(21) Appl. No.: 10/425,945

(22) Filed: Apr. 30, 2003

(51) Int. Cl.$^7$ ................................................ H05K 7/20
(52) U.S. Cl. ...................... 165/185; 165/80.2; 257/720; 361/704
(58) Field of Search ................................ 165/80.3, 185, 165/80.2; 361/704, 710; 257/719, 720, 722; 174/16.3

(56) References Cited

U.S. PATENT DOCUMENTS

| | | | |
|---|---|---|---|
| 5,594,623 A | * | 1/1997 | Schwegler ................ 361/697 |
| 5,969,949 A | * | 10/1999 | Kim et al. ................ 361/704 |
| 6,245,442 B1 | * | 6/2001 | Towata et al. ............ 428/614 |

FOREIGN PATENT DOCUMENTS

| | | | | |
|---|---|---|---|---|
| JP | 2-281642 A | * | 11/1990 | ........... H01L/23/40 |
| JP | 11-195738 A | * | 7/1999 | ......... H01L/23/467 |
| JP | 2000-77698 A | * | 3/2000 | ......... H01L/31/042 |

* cited by examiner

Primary Examiner—Allen Flanigan

(57) ABSTRACT

A heat sink structure, having a heat sink and a thermal conductive block. The heat sink has a receiving slot recessed from a central portion of a bottom thereof. The thermal conductive block has a plurality of uneven surfaces thereon and a plurality of conical through holes therein. The thermal conductive block is pressed into the receiving slot while the heat sink is softened by heating, and the heat sink has a thermal expansion coefficient larger than the thermal conductive block, such that a wall of the receiving slot is partly extruded into or through the conical through holes, and the wall outside of the conical through holes is partly contracted into the conical holes in a cooling process after the thermal conductive block is pressed into the receiving slot. The conical through holes also provides the function of expelling gas, such that the thermal conductive block is firmly attached to the heat sink, and the heat dissipation effect is further enhanced.

5 Claims, 5 Drawing Sheets

HEAT SINK STRUCTURE

BACKGROUND OF THE INVENTION

The present invention relates to a heat sink structure and, more particularly, to a heat sink including a highly conductive thermal conductive block on one surface thereof. The thermal conductive block is firmly attached to the heat sink to enhance the overall heat dissipation of the heat sink structure.

The conventional cooler 6 applied to a CPU is shown in FIGS. 1 and 2. The cooler 6 includes an aluminum extrusion, and the aluminum extrusion cooler 6 includes a plurality of fins 61 integrally formed with the aluminum extrusion cooler 6. A fan 62 is installed over the fins 61 to enhance the heat dissipation effect. In addition, a thermal conductive block 63 is installed at a bottom of the cooler 6. The thermal conductive block 63 is made of highly thermal conductive material such as copper, and the method for installing the thermal conductive block 63 includes forming a receiving slot 64 recessed from the bottom, followed by attaching the thermal conductive block 63 in the receiving slot 64. Therefore, the cooler 6 is mounted on the CPU 71 on the printed circuit board 7 by adhering the thermal conductive block 63 on the CPU 71. The heat generated by the CPU 71 can thus be delivered by the thermal conductive block 63 to the cooler 6, and then dissipated or absorbed by the fan 62 to achieve the heat dissipation function.

However, while mounting the thermal conductive block 63 to the cooler 6, the thermal conductive block 63 is typically glued within the receiving slot 64. As space or gap inevitably exists between the thermal conductive block 63 and the cooler 6, a poor joint is frequently formed to affect the overall heat dissipation effect.

To resolve the problems caused by the conventional cooler as described above, the Applicant, with many years experience in this field, has developed an improved cooler as follows.

BRIEF SUMMARY OF THE INVENTION

The present invention provides a heat sink structure which includes a thermal conductive block firmly attached thereto to result in an enhanced heat dissipation effect.

The heat sink structure provided by the present invention comprises a receiving slot recessed from a bottom thereof. A thermal conductive block is installed in the receiving slot. At four side walls and a top wall of the thermal conductive block, regularly or irregular shaped uneven surfaces are formed. The thermal conductive block is made of material with high thermal conductive efficiency such as copper. A plurality of conical through holes is formed in the thermal conductive block. While assembling, the heat sink is softened by heating first, and the thermal conductive block is pressed into the receiving slot by surge process. As the uneven surfaces increases the contact area between the thermal conductive block and the receiving slot, the wall of the receiving slot is partially pressed into the conical through holes. In a cooling process, the wall of the receiving slot out of the conical through holes tends to contract into the conical through holes; and thus the connection between the thermal conductive block and the receiving slot is further enhanced.

The present invention is also characterized in that the conical through holes formed on the thermal conductive block also provide the gassing function. When the thermal conductive block is pressed into the receiving slot, air can be expelled from the conical through holes, allowing the thermal conductive block firmly fixed to the heat sink.

BRIEF DESCRIPTION OF THE DRAWINGS

These, as well as other features of the present invention, will become apparent upon reference to the drawings wherein.

DETAILED DESCRIPTION OF THE INVENTION

Figure 1:
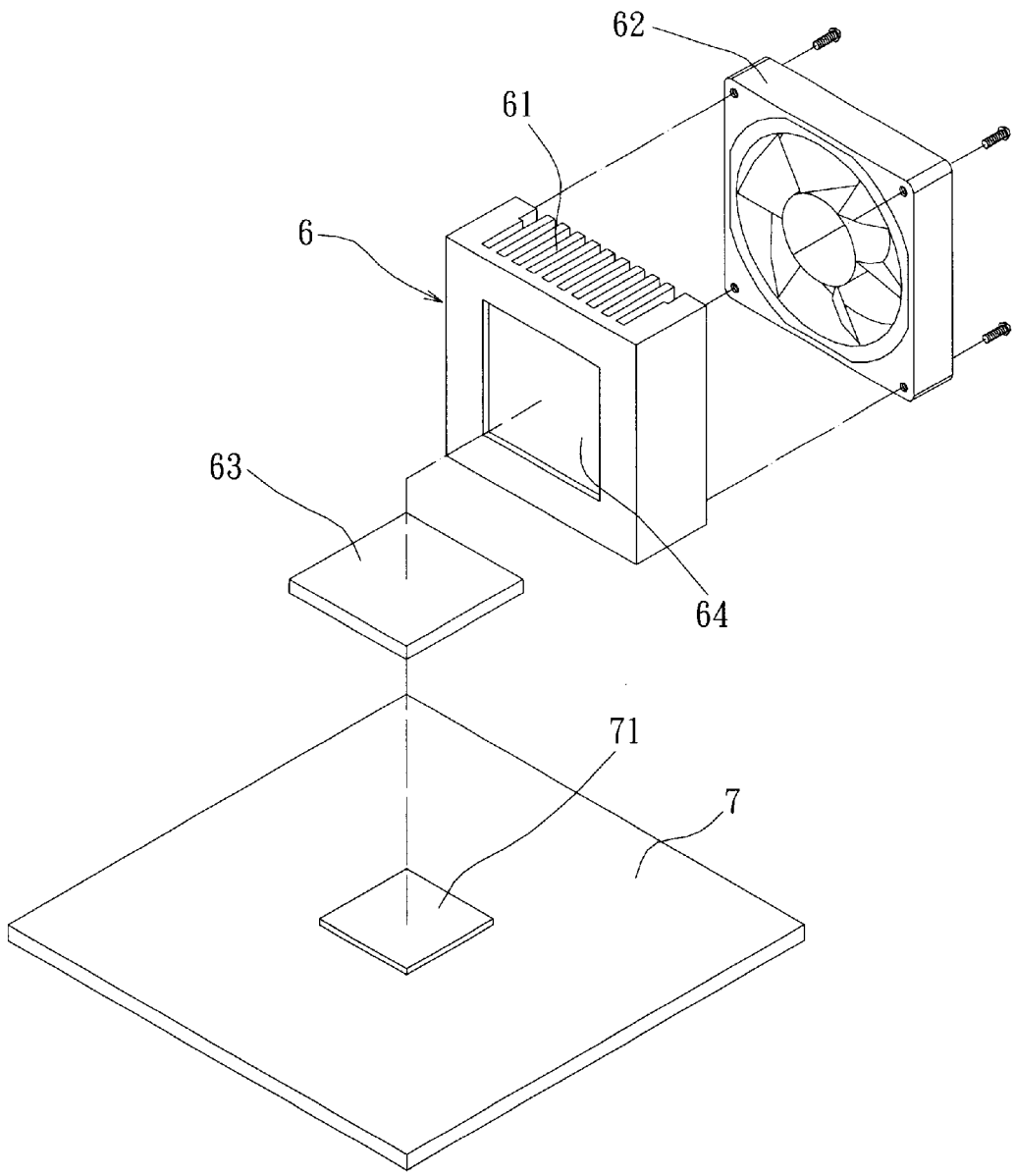
FIG. 1 shows the exterior structure of a conventional cooler.
Figure 2:
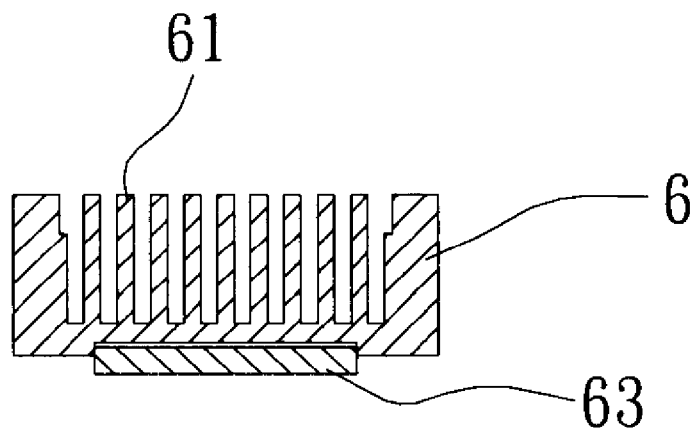
FIG. 2 shows a cross sectional view of the conventional cooler.
Figure 3:
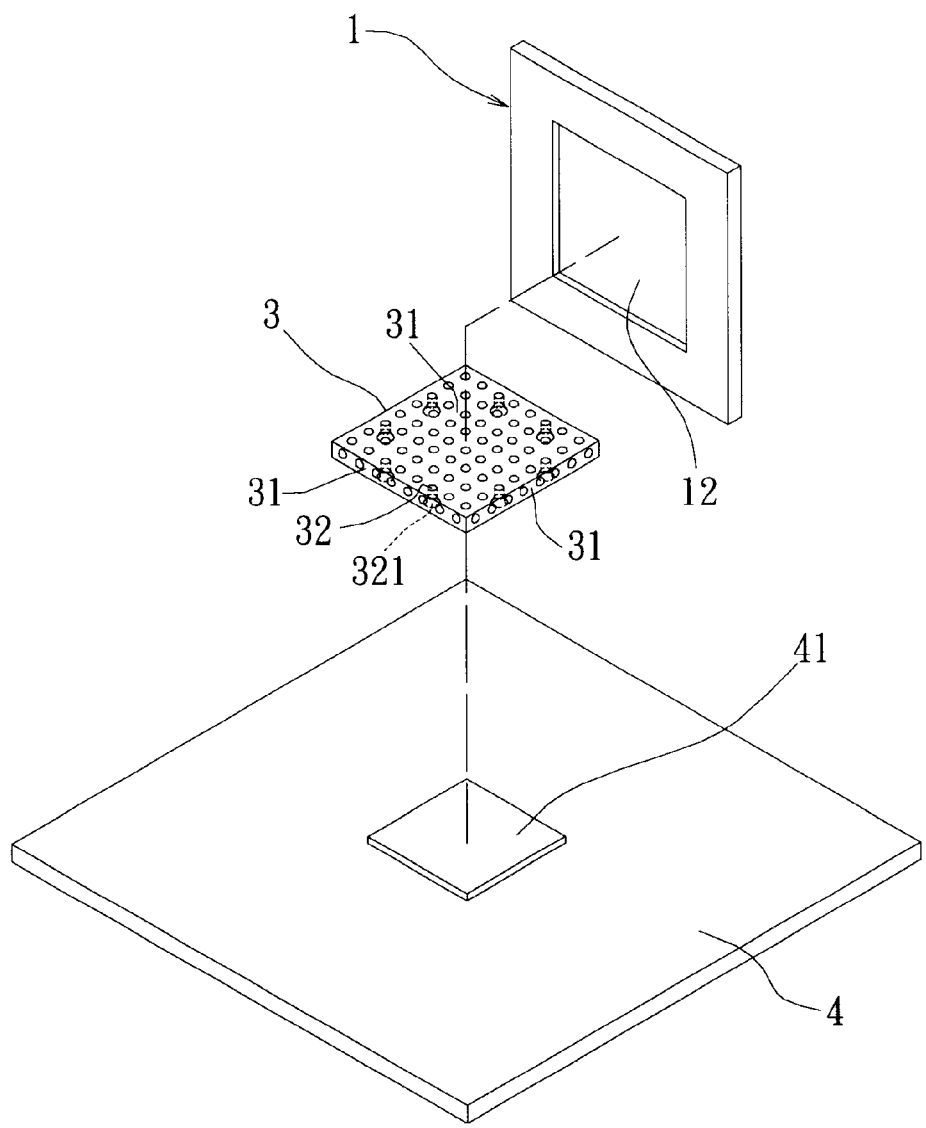
FIG. 3 shows the exterior structure of a cooler provided by the present invention.

The present invention provides a heat sink structure as shown in FIG. 3. The heat sink 1 provided by the present invention can be disposed on a CPU 41 of a printed circuit board 4. The heat sink 1 includes a receiving slot 12 recessed from a central portion of a bottom thereof, and a thermal conductive block 3 installed in the receiving slot 12 to enhance the thermal dissipation effect. Preferably, the thermal conductive block 3 is made of highly thermal conductive material such as copper.

Figure 4:
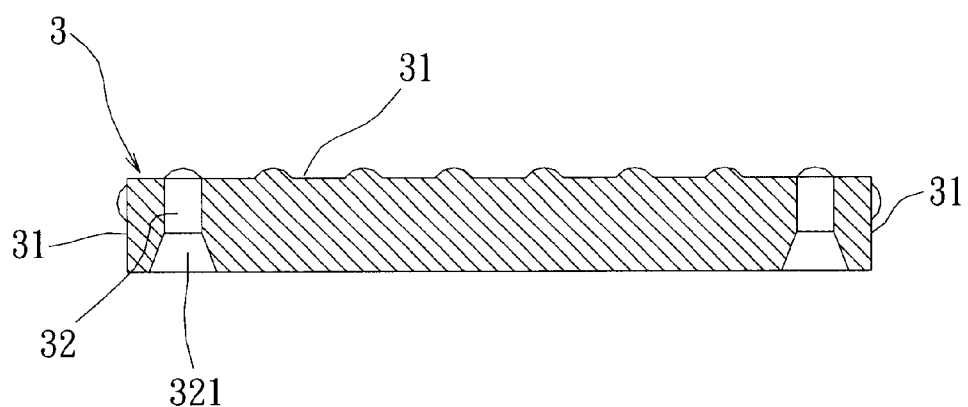
FIG. 4 shows the cross sectional view of the thermal conductive block by the present invention.

Referring to FIGS. 3 and 4, in the present invention, the thermal conductive block 3 includes a plurality of regularly or irregularly shaped uneven surfaces 31 formed on four side walls and a top wall thereof. The thermal conductive block 3 further comprises a plurality of conical through holes 32. The conical through holes 32 proximal to the CPU 41 includes a horn-like opening 321.

Figure 5:
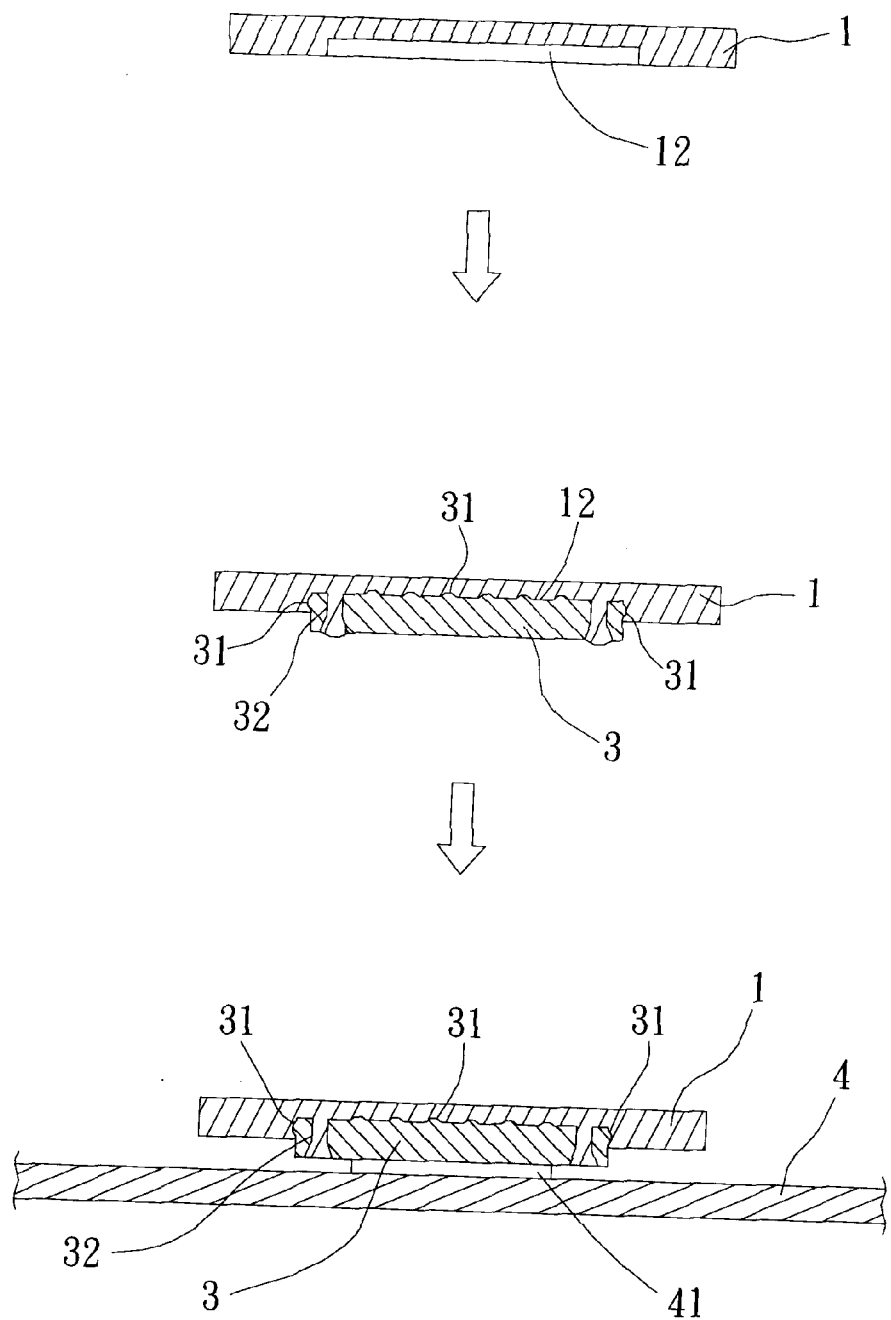
FIG. 5 shows the assembly of the cooler.

As shown in FIG. 5, while installing the thermal conductive block 3 I on the heat sink 1, the heat sink 1 is softened by a heating process. The heating temperature is about 400° C. After the heat sink 1 is softened, the thermal conductive block 3 is pressed into the receiving slot 12. Meanwhile, as the large thermal expansion coefficient of the heat sink 1, which is typically made of aluminum, for example, plus the contact area between the receiving slot 12 and the thermal conductive block 3 is increased by the uneven surfaces 31, partial portions of the contact walls of the receiving slot 12 are extruded into, or even through, the conical holes 32 after thermal expansion. While the thermal conductive block 3 is pressed into the receiving slot 12, gas can be expelled from the conical through holes 32. Therefore, the thermal conductive block 3 is firmly attached to the heat sink 1.

A cooling process is then performed. The cooling process contracts the wall of the receiving slot 12 extruded out of the conical through holes 32 into the conical through holes 32. Thereby, the connection between the thermal conductive block 3 and the heat sink 1 is further improved. The thermal conductive block 3 and the CPU 41 are then polished and mounted to the CPU.

In the present invention, by applying the thermal expansion principle, the thermal conductive block 3 and the heat sink 1 are further firmly connected to each other, and a gapless connection can be established. Therefore, the heat generated by the CPU 41 can be effectively transferred to the heat sink 1 via the thermal conductive block 3, and the heat dissipation effect is greatly improved.

This disclosure provides exemplary embodiments of a child safety blind. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed:

1. A heat sink structure, comprising:

a heat sink, having a receiving slot recessed from a bottom surface thereof; and a thermal conductive block including a plurality of uneven surfaces and a plurality of conical through holes therein;

whereby the thermal conductive block is pressed into the receiving slot while the heat sink is softened by heating, and the heat sink has a thermal expansion coefficient larger than the thermal conductive block, such that a wall of the receiving slot is partly extruded into or through the conical through holes, and the partly extruded wall is contracted after cooling to firmly mount the thermal conductive block to the heat sink.

2. The heat sink structure according to claim 1, wherein the uneven surface have a regular or irregular arrangement of protrusions.

3. The heat sink structure according to claim 1, wherein the conical through hole includes a horn-like opening distant from the heat sink.

4. The heat sink structure according to claim 1, wherein the heat sink is heated at a temperature of about 400° C.

5. The heat sink structure according to claim 1, wherein the thermal conductive block is made of copper.

* * * * *